US012787664B2

(12) United States Patent
Cheng

(10) Patent No.: US 12,787,664 B2
(45) Date of Patent: Nov. 3, 2026

(54) ENHANCEMENT-MODE SEMICONDUCTOR STRUCTURE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 344 days.

(21) Appl. No.: 18/584,348

(22) Filed: Feb. 22, 2024

(65) Prior Publication Data

US 2025/0079170 A1 Mar. 6, 2025

(30) Foreign Application Priority Data

Aug. 28, 2023 (CN) ......................... 202311091211.6

(51) Int. Cl.

| | |
|---|---|
| ***H10P 14/20*** | (2026.01) |
| ***H10D 12/01*** | (2025.01) |
| ***H10D 62/60*** | (2025.01) |
| ***H10D 62/832*** | (2025.01) |
| ***H10P 30/20*** | (2026.01) |
| ***H10P 50/00*** | (2026.01) |

(52) U.S. Cl.

CPC ....... *H10P 14/3441* (2026.01); *H10D 12/031* (2025.01); *H10D 62/60* (2025.01); *H10D 62/8325* (2025.01); *H10P 30/204* (2026.01); *H10P 30/21* (2026.01); *H10P 50/00* (2026.01)

(58) Field of Classification Search

CPC ... H10P 14/3441; H10P 50/00; H10D 12/031; H10D 62/60; H10D 30/831

See application file for complete search history.

(56) References Cited

U.S. PATENT DOCUMENTS

| | | | | |
|---|---|---|---|---|
| 6,982,193 | B2 * | 1/2006 | Hossain ............. | H10D 30/0291 438/420 |
| 2007/0278592 | A1 * | 12/2007 | Tu ....................... | H10D 30/0293 257/E29.066 |
| 2018/0175149 | A1 * | 6/2018 | Takaya ................. | H10D 12/031 |
| 2018/0197983 | A1 * | 7/2018 | Kinoshita ............ | H10D 12/031 |

* cited by examiner

*Primary Examiner* — Bac H Au

(74) *Attorney, Agent, or Firm* — Westbridge IP LLC

(57) ABSTRACT

Disclosed are an enhancement-mode semiconductor structure and a method for manufacturing the same. The method includes: providing a substrate of a first conductivity type; growing a first semiconductor layer of the first conductivity type and a second semiconductor layer of the first conductivity type on the substrate sequentially; etching a groove on a side, away from the substrate, of the second semiconductor layer, where the groove penetrates through the second semiconductor layer and partially penetrates through the first semiconductor layer; and growing a third semiconductor layer of a second conductivity type in the groove by an in-situ doped selective epitaxy process, where the third semiconductor layer has at least two different doping concentrations along a first direction and has at least two different widths along a second direction.

20 Claims, 16 Drawing Sheets

ENHANCEMENT-MODE SEMICONDUCTOR STRUCTURE AND METHOD FOR MANUFACTURING THE SAME

CROSS-REFERENCE TO RELATED APPLICATIONS

The present application claims priority to Chinese Patent Application No. 202311091211.6, filed on Aug. 28, 2023, which is hereby incorporated by reference in its entirety.

TECHNICAL FIELD

The present disclosure relates to the field of semiconductor technologies, and in particular, to an enhancement-mode semiconductor structure and a method for manufacturing an enhancement-mode semiconductor structure.

BACKGROUND

A Silicon Carbide Junction Field-Effect Transistor (SiC JFET) is a depletion device which can control a drain-source current by applying a voltage at a PN junction to change the on-off of a conductive channel. The SiC JFET has the advantages of simple driving, no gate-oxide layer and high reliability, and is suitable in high temperature, high voltage and high reliable power systems.

Selective doping, for obtaining the PN junction in a SiC device, is performed by ion implantation. Firstly, high ion implantation energy is required during an implantation process, thus high requirements are required for an implantation equipment; secondly, high ion implantation energy easily causes great damage to the lattice of implanted materials; in addition, the diffusion phenomenon of implanted ions results in inaccurate width of a channel, and an unreliable PN junctions is easily broken down, thereby causing a leakage of electrical current.

SUMMARY

In view of this, the present disclosure provides an enhancement-mode semiconductor structure and a method for manufacturing an enhancement-mode semiconductor structure, to solve a problem caused by a formation of a PN junction in a silicon carbide junction field-effect transistor by ion implantation in conventional technologies.

According to an aspect of the present disclosure, an embodiment of the present disclosure provides a method for manufacturing an enhancement-mode semiconductor structure, including: S1, providing a substrate of a first conductivity type; S2, growing a first semiconductor layer of the first conductivity type and a second semiconductor layer of the first conductivity type on the substrate sequentially, where a doping concentration of the substrate and the second semiconductor layer is higher than a doping concentration of the first semiconductor layer; S3, etching a groove on a side, away from the substrate, of the second semiconductor layer, where the groove penetrates through the second semiconductor layer and partially penetrates through the first semiconductor layer; and S4, growing a third semiconductor layer of a second conductivity type in the groove by an in-situ doped selective epitaxy process, where the third semiconductor layer has at least two different doping concentrations along a first direction and has at least two different widths along a second direction, the first direction is perpendicular to a plane where the substrate is located, and the second direction is parallel to an extending direction of the groove.

As an optional embodiment, along the first direction, a change mode of a doping concentration of the third semiconductor layer is changed periodically, increased gradually, decreased gradually, increased at first and then decreased, or decreased at first and then increased.

As an optional embodiment, along the first direction, a change mode of a width of the third semiconductor layer is constant, increased gradually, or decreased gradually.

As an optional embodiment, along the second direction, a change mode of a width of the third semiconductor layer is increased gradually, decreased gradually, increased in a step-shaped, decreased in a step-shaped, increased at first and then decreased, or decreased at first and then increased.

As an optional embodiment, a projection, on a plane where the substrate is located, of a sidewall, extending along the second direction, of the third semiconductor layer is a sine wave, a rectangular wave, or a triangular wave.

As an optional embodiment, a sidewall, extending along the second direction, of the third semiconductor layer is provided with a plurality of protrusions, and widths of the plurality of protrusions are increased at first and then decreased along the second direction.

As an optional embodiment, the plurality of the protrusions are arranged at intervals or adjacent to each other.

As an optional embodiment, widths of adjacent two third semiconductor layers are complementary along the second direction.

As an optional embodiment, the groove is etched twice to form a bottom rounded structure.

As an optional embodiment, after the S3, the method further includes: S31, performing ion implantation on a surface of the first semiconductor layer exposed by the groove, to form a fourth semiconductor layer of the second conductivity type.

As an optional embodiment, a doping concentration of the fourth semiconductor layer is greater than the doping concentration of the third semiconductor layer.

As an optional embodiment, the S4 includes: S41, growing the third semiconductor layer of the second conductivity type in the groove by the in-situ doped selective epitaxy process, where a thickness of the third semiconductor layer is greater than a depth of the groove; S42, removing a redundant portion of the third semiconductor layer which is on a surface of the second semiconductor layer by chemical mechanical polishing, and performing a planarization treatment on the surface of the second semiconductor layer.

As an optional embodiment, after the S4, the method further includes: S5, forming a source, a drain, and a gate, where the source is on a surface, away from the substrate, of the second semiconductor layer, the drain is on a surface, away from the second semiconductor layer, of the substrate, and the gate is on a surface, away from the substrate, of the third semiconductor layer.

According to another aspect of the present disclosure, an enhancement-mode semiconductor structure is provided, including: a substrate of a first conductivity type, a first semiconductor layer of the first conductivity type and a second semiconductor layer of the first conductivity type which are stacked sequentially, where a doping concentration of the substrate and the second semiconductor layer is higher than a doping concentration of the first semiconductor layer; and a groove, where the groove penetrates through the second semiconductor layer and partially penetrates through the first semiconductor layer, and a third semiconductor layer of the second conductivity type is disposed in the groove; where the third semiconductor layer has at least two different doping concentrations along a first direction and has at least two different widths along a second direction, the first direction is perpendicular to a plane where the substrate is located, and the second direction is parallel to an extending direction of the groove.

As an optional embodiment, a depth of the groove is 0.1 μm-2 μm.

As an optional embodiment, a spacing between adjacent two grooves is 0.1 μm-1 μm.

As an optional embodiment, the enhancement-mode semiconductor structure further includes: a fourth semiconductor layer of the second conductivity type, where the fourth semiconductor layer is disposed in the first semiconductor layer below the groove.

As an optional embodiment, a width of the fourth semiconductor layer is greater than or equal to a width of the third semiconductor layer.

As an optional embodiment, a thickness of the fourth semiconductor layer is 50 nm-500 nm.

As an optional embodiment, along the first direction, a change mode of the doping concentration of the third semiconductor layer is changed periodically, increased gradually, decreased gradually, increased at first and then decreased, or decreased at first and then increased.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are a part rather than all of the embodiments of the present disclosure. All other embodiments obtained by a person of ordinary skill in the art based on the embodiments of the present disclosure without creative efforts shall fall within the protection scope of the present disclosure.

In order to solve a problem caused by a formation of a PN junction in a silicon carbide junction field-effect transistor by ion implantation, an enhancement-mode semiconductor structure and a method for manufacturing an enhancement-mode semiconductor structure is provided. A substrate of a first conductivity type, a first semiconductor layer of the first conductivity type and a second semiconductor layer of the first conductivity type are stacked sequentially. A groove is etched to penetrate through the second semiconductor layer and partially penetrate through the first semiconductor layer. A third semiconductor layer of a second conductivity type is formed in the groove by an in-situ doped selective epitaxy process. The third semiconductor layer has at least two different doping concentrations along a first direction and has at least two different widths along a second direction. By using the method of an in-situ doping selective epitaxy, the width accuracy of the third semiconductor layer may be improved, so as to improve the width accuracy of a channel between third semiconductor layers, thereby improving the reliability of the enhancement-mode semiconductor structure.

The enhancement-mode semiconductor structure and the method for manufacturing an enhancement-mode semiconductor structure mentioned in the present disclosure are further illustrated below in conjunction with FIG. 1 to FIG. 17.

Figure 1:
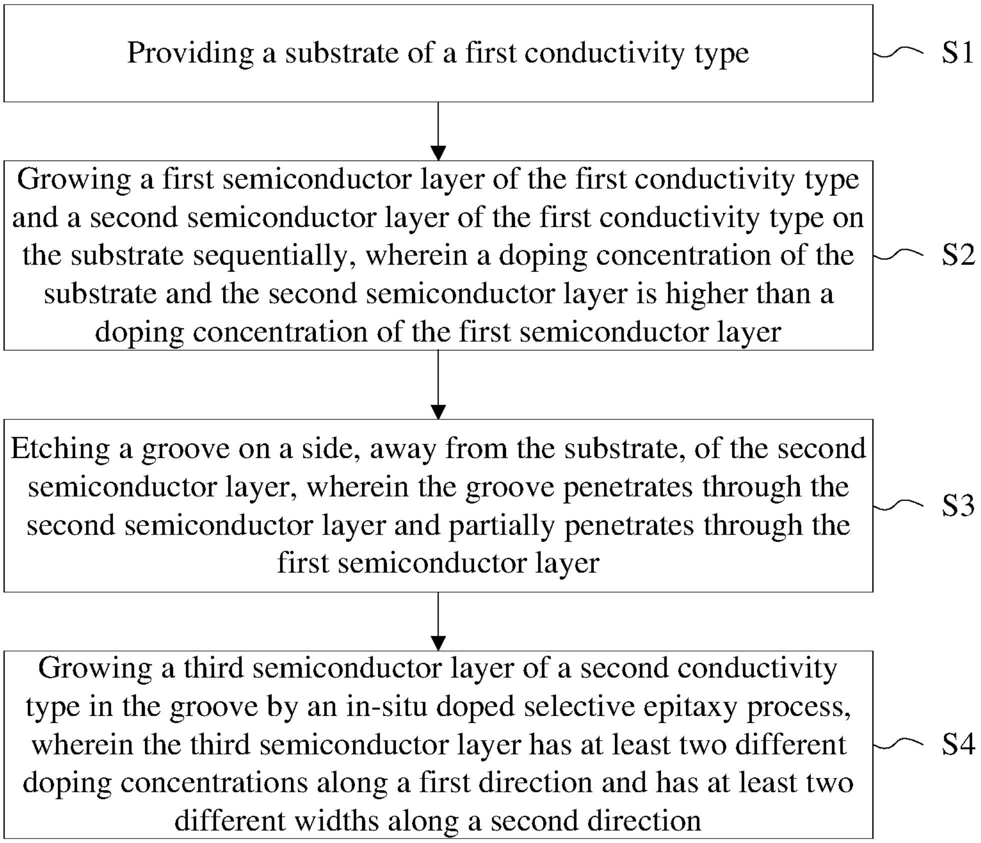
FIG. 1 is a flowchart of a method for manufacturing an enhancement-mode semiconductor structure according to an embodiment of the present disclosure.

FIG. 1 is a flowchart of a method for manufacturing an enhancement-mode semiconductor structure according to an embodiment of the present disclosure; and FIG. 2, FIG. 3, FIG. 4*a* to FIG. 4*c*, FIG. 5, FIG. 7, and FIG. 8*a* to FIG. 8*c* are schematic diagrams of intermediate structures corresponding to a process in FIG. 1. As shown in FIG. 1, the method includes the following contents.

Figure 2:
FIG. 2, FIG. 3, FIG. 4*a* to FIG. 4*c* and FIG. 5 are schematic diagrams of intermediate structures corresponding to processes in FIG. 1.

Step S1: As shown in FIG. 2, providing a substrate 10 of a first conductivity type. A material of the substrate 10 includes silicon carbide.

Figure 3:
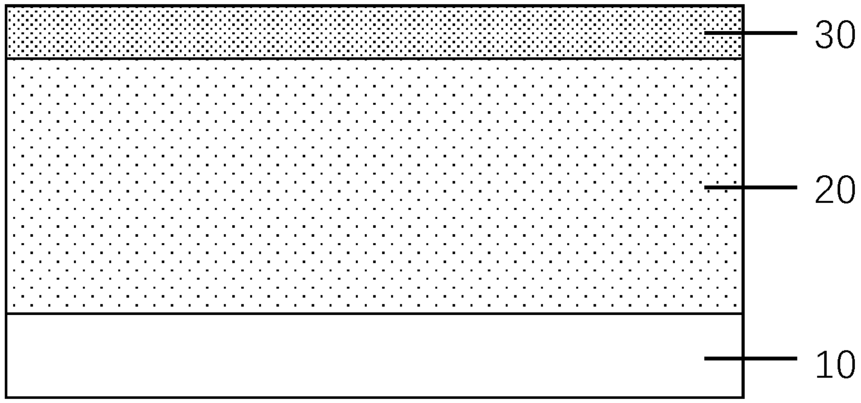

Step S2: As shown in FIG. 3, growing a first semiconductor layer 20 of the first conductivity type and a second semiconductor layer 30 of the first conductivity type on the substrate 10 sequentially, where a doping concentration of the substrate 10 and the second semiconductor layer 30 is higher than a doping concentration of the first semiconductor layer 20. A material of the first semiconductor layer 20 and a material of the second semiconductor layer 30 are the same as the material of the substrate 10, including silicon carbide.

Figure 4A:
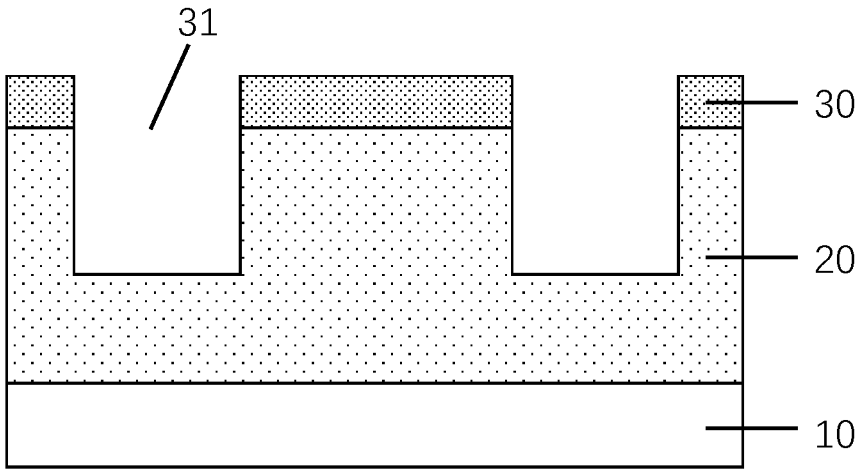

Step S3: As shown in FIG. 4*a*, etching a groove 31 on a side, away from the substrate 10, of the second semiconductor layer 30, where the groove 31 penetrates through the second semiconductor layer 30 and partially penetrates through the first semiconductor layer 20.

Figure 4B:
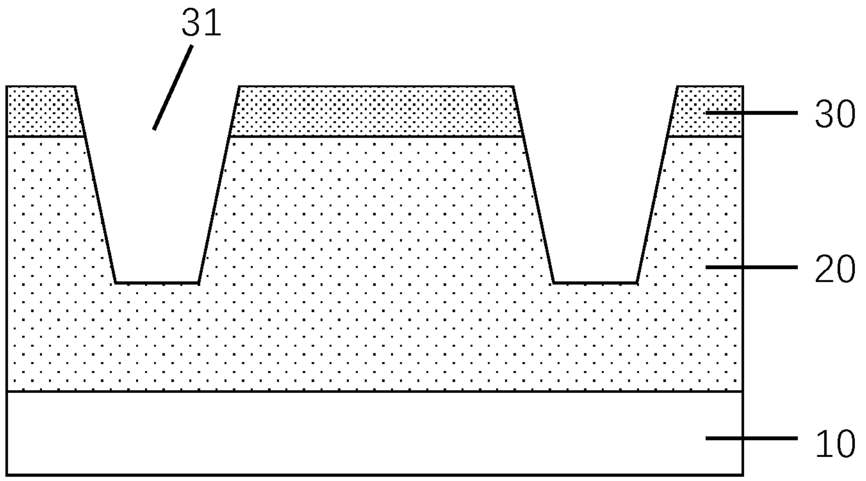
Figure 4C:
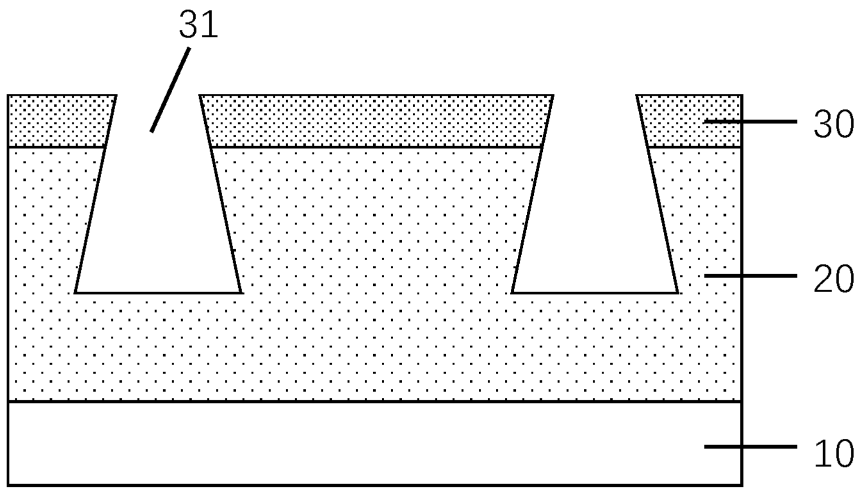
Figure 5:
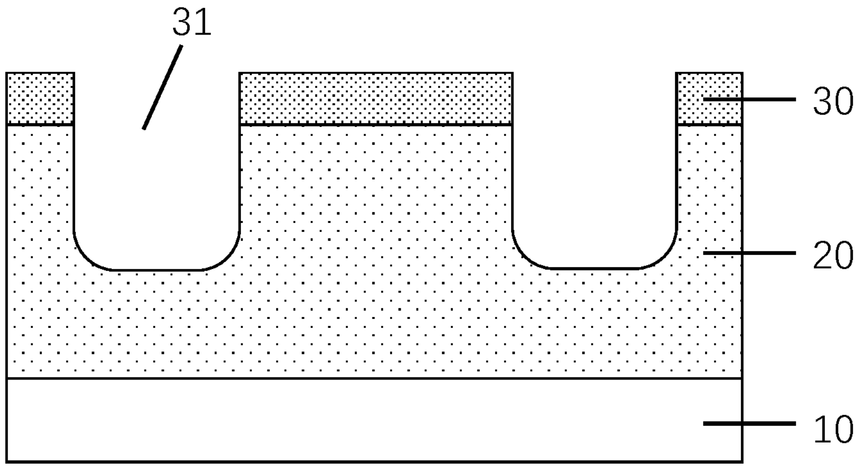

In an embodiment, a depth of the groove 31 is 0.1 μm-2 μm, a spacing between adjacent two grooves 31 is 0.1 μm-1 μm, and a width of a channel of the semiconductor structure may be controlled by controlling the spacing between adjacent two grooves 31. Along a direction away from the substrate 10, a width of the groove 31 may be constant (as shown in FIG. 4*a*), increased gradually (as shown in FIG. 4*b*), or decreased gradually (as shown in FIG. 4*c*). A width of the third semiconductor layer 40 grown subsequently in the groove 31 may be controlled by controlling the width of the groove 31. Optionally, as shown in FIG. 5, the groove may be etched twice to form a bottom rounded structure. The rounded structure at the bottom of the groove 31 can reduce the electric field intensity at the bottom of the groove 31, thereby improving the breakdown voltage.

Figure 6:
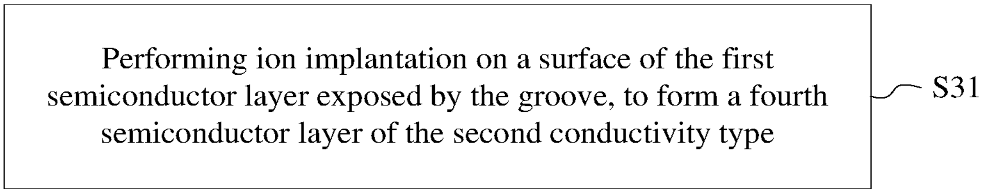
FIG. 6 is a flowchart of a method for manufacturing an enhancement-mode semiconductor structure according to another embodiment of the present disclosure.

In an embodiment, as shown in FIG. 6, after the S3, the method may further include step S31.

Figure 7:
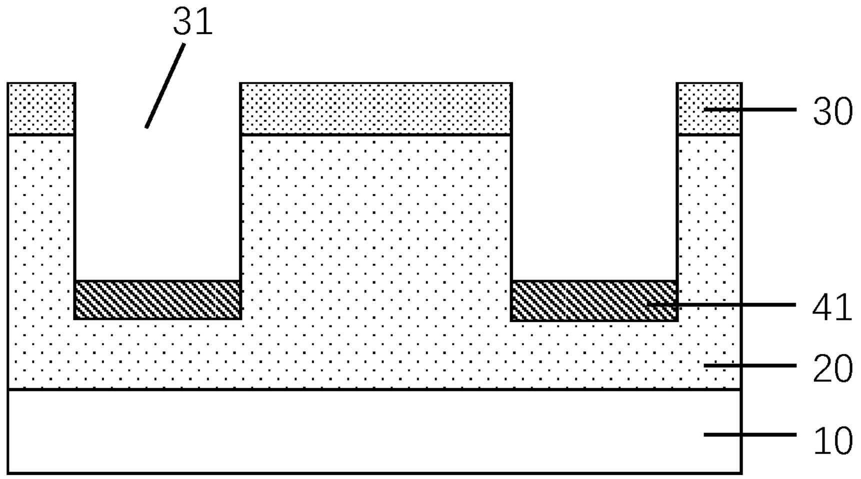
FIG. 7 and FIG. 8*a* to FIG. 8*c* are schematic diagrams of intermediate structures corresponding to processes in FIG. 1.

Step S31, as shown in FIG. 7, performing ion implantation on a surface of the first semiconductor layer 20 exposed by the groove 31, to form a fourth semiconductor layer 41 of the second conductivity type. A doping concentration of the fourth semiconductor layer is greater than the doping concentration of the third semiconductor layer 40 that is grown subsequently in the groove 31, to prevent an injection of minority carriers in forward operation. A width of the fourth semiconductor layer 41 is greater than or equal to the width of the groove 31 due to the diffusion of the implanted ions, that is, the width of the fourth semiconductor layer 41 is greater than or equal to the width of the third semiconductor layer 40 that is grown subsequently in the groove 31. A thickness of the fourth semiconductor layer is 50 nm-500 nm. Before the third semiconductor layer 40 is grown in the groove 31 by the secondary epitaxy, the fourth semiconductor layer 41 with a same conductive type as the third semiconductor layer 40 is formed in the groove 31 by ion implantation, so as to improve the lattice quality of the third semiconductor layer 40 grown on the surface of the fourth semiconductor layer 41, thereby improving the reliability of the overall device structure.

Figure 8A:
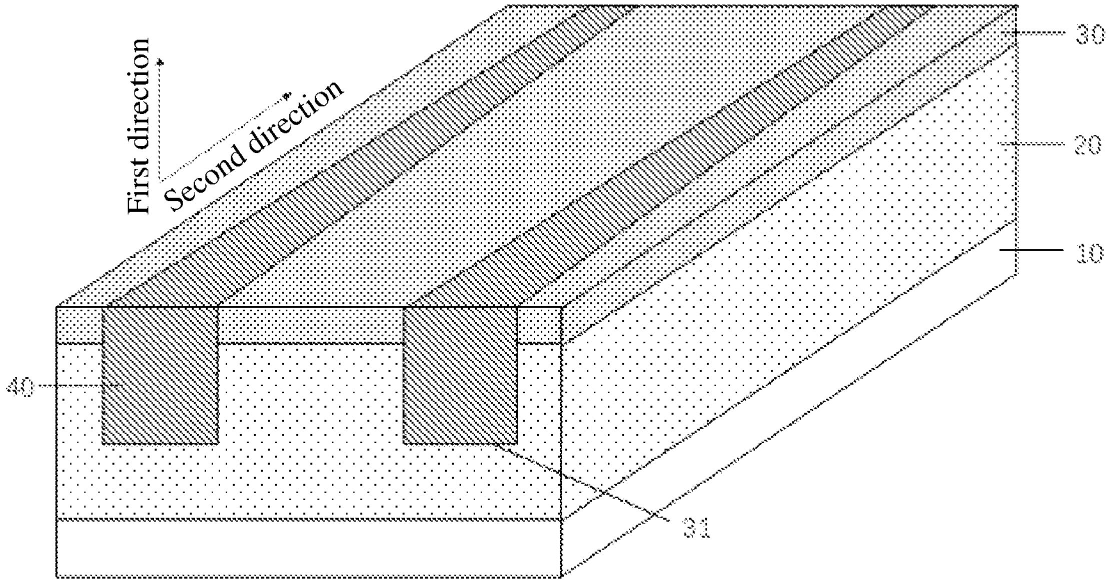

Step S4, as shown in FIG. 8*a*, growing the third semiconductor layer 40 of the second conductivity type in the groove 31 by the in-situ doped selective epitaxy process, where the third semiconductor layer 40 has at least two different doping concentrations along a first direction and has at least two different widths along a second direction, the first direction is perpendicular to a plane where the substrate 10 is located, and the second direction is parallel to an extending direction of the groove 31. The third semiconductor layer 40 is grown by an in-situ doped selective epitaxy process after the groove 31 is etched, so that a PN junction is formed by the third semiconductor layer 40 and the first semiconductor layer 20 with different conductivity types. A channel is in a depletion state when a gate voltage is 0, thereby achieving an enhancement-mode semiconductor structure. A method for etching the groove 31 may control a shape of the third semiconductor layer 40 by controlling a shape of the groove 31, thereby adjusting and controlling a shape of a depletion layer and a shape of the channel. An in-situ doping selective epitaxy method may control the doping concentration of the third semiconductor layer 40, thereby changing an equivalent width of the depletion layer. The combination of two methods may adjust and control the depletion layer and the channel of the semiconductor structure multi-dimensionally. Moreover, the third semiconductor layer 40 is formed by the in-situ doped selective epitaxy method, so that lattice damage, caused by an ion implantation method, to the first semiconductor layer 20 is avoided, and the width inaccuracy, caused by a diffusion phenomenon of the ion implantation method, of the third semiconductor layer 40 is avoided, thereby improving the width accuracy of the channel between third semiconductor layers 40 and improving the reliability of the overall device structure.

Figure 8B:
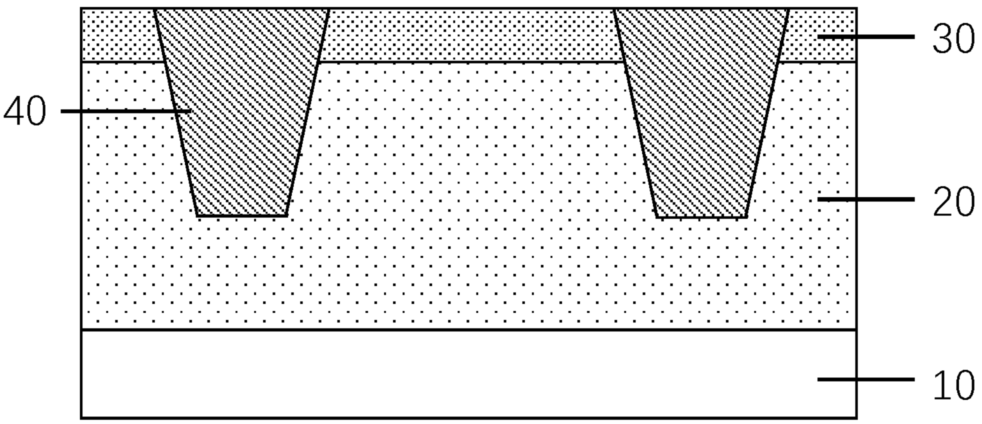
Figure 8C:
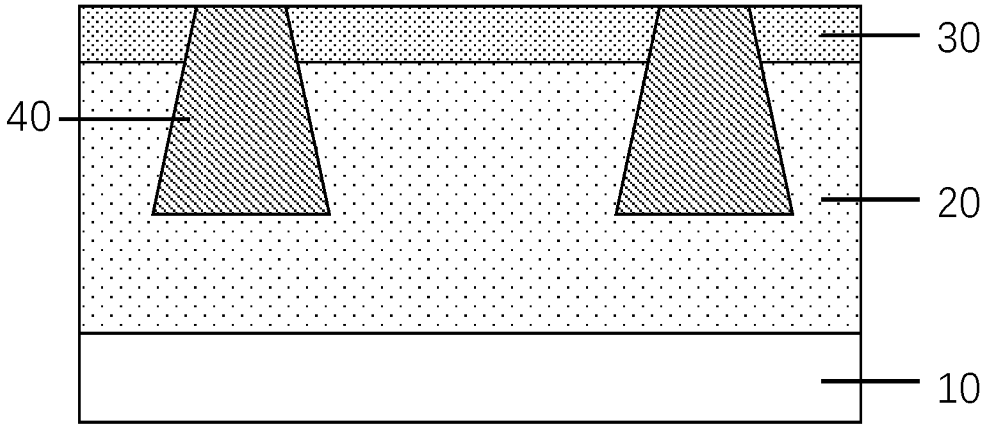

In an embodiment, since the width of the groove 31 may be constant (as shown in FIG. 4*a*), increased gradually (as shown in FIG. 4*b*), or decreased gradually (as shown in FIG. 4*c*) along the first direction, and the width of the third semiconductor layer 40 grown subsequently in the groove 31 may be controlled by controlling the width of groove 31, the width of the third semiconductor layer 40 may also be constant (as shown in FIG. 8*a*), increased gradually (as shown in FIG. 8*b*), or decreased gradually (as shown in FIG. 8*c*) along the first direction. The width of the third semiconductor layer 40 may be adjusted by designing the width of the groove 31, to make a contact interface between the third semiconductor layer 40 and the side of the first semiconductor layer 20 be an inclined surface, and conductivity types of the third semiconductor layer 40 and the first semiconductor layer 20 are different, so that a contact interface of the formed PN junction may be an inclined surface. On one hand, by controlling a shape of the contact interface of the PN junction, the breakdown voltage is effectively improved, and the reverse breakdown voltage is increased. On the other hand, in an on-state, since the contact interface is an inclined surface, and a conductive channel is also an inclined channel, electrons which flow from a source to a drain may flow dispersedly to both sides, and downward simultaneously, thereby increasing the movement path of the electrons and further reducing the on-state resistance of the semiconductor structure.

Figure 9A:
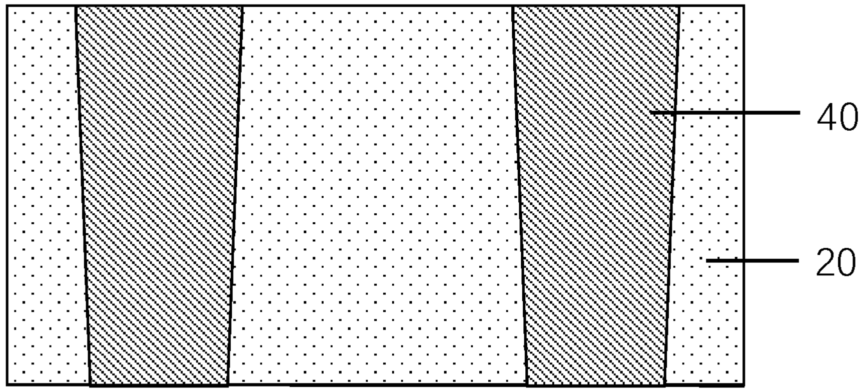
FIG. 9*a* to FIG. 9*i* are schematic top views of intermediate structures of an enhancement-mode semiconductor structure according to some embodiments of the present disclosure.
Figure 9B:
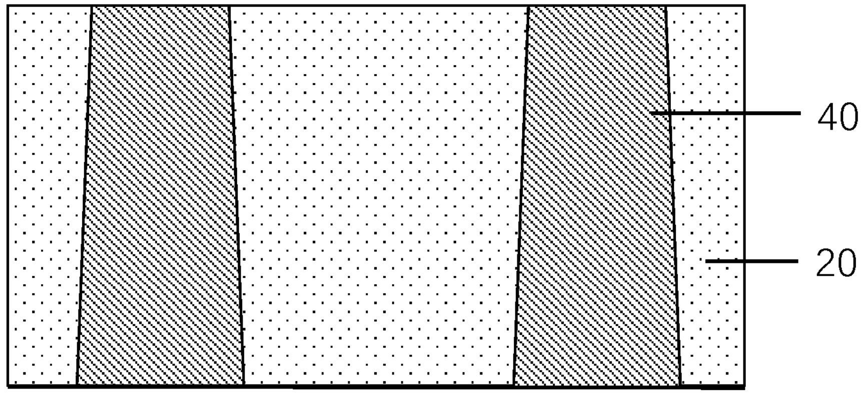
Figure 9C:
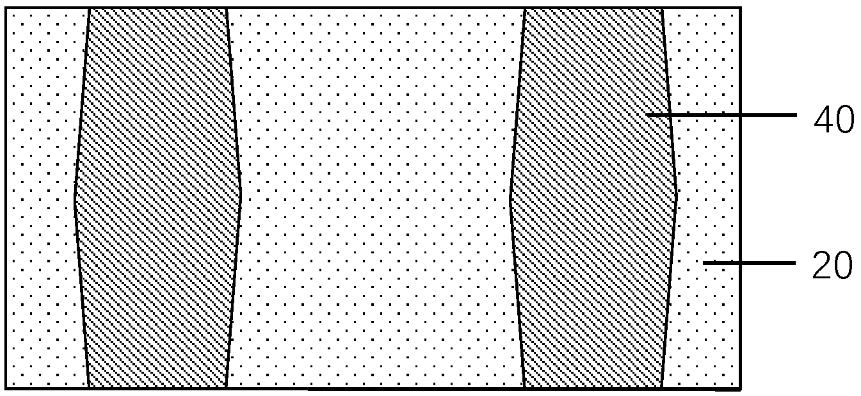
Figure 9D:
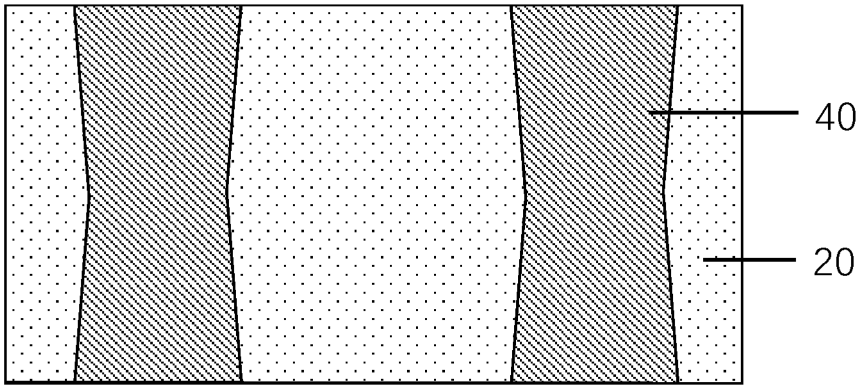
Figure 9E:
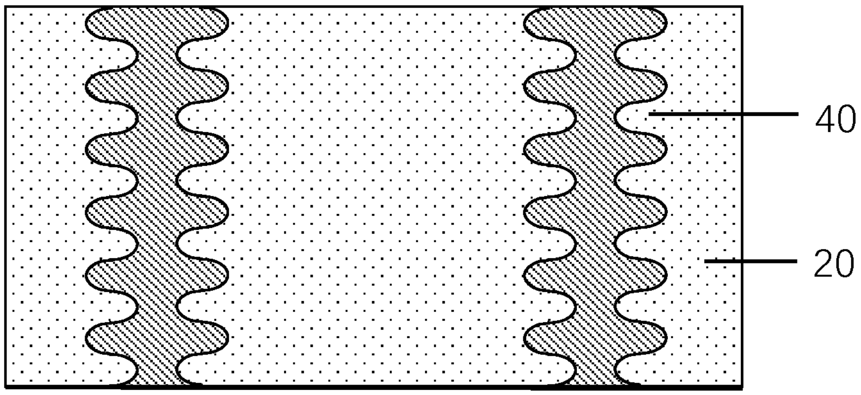
Figure 9F:
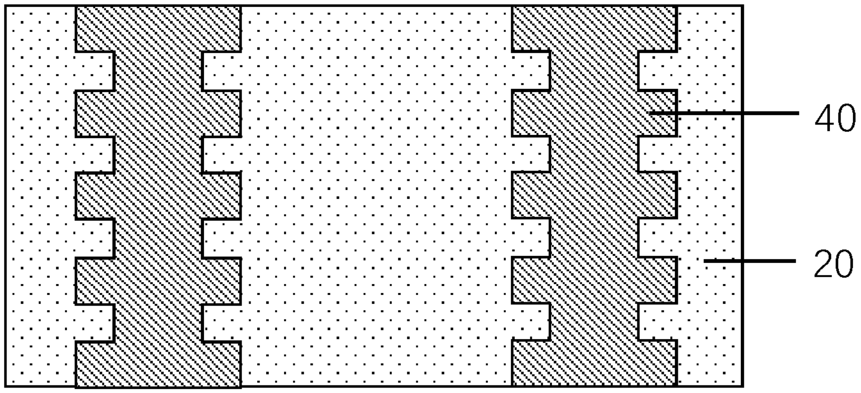
Figure 9G:
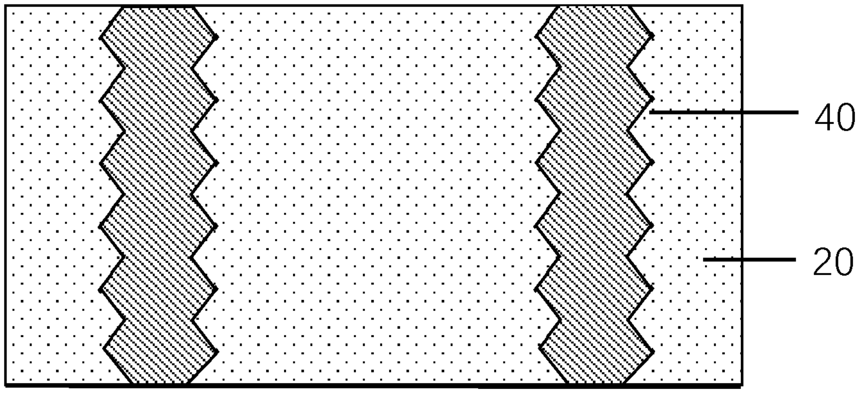
Figure 9H:
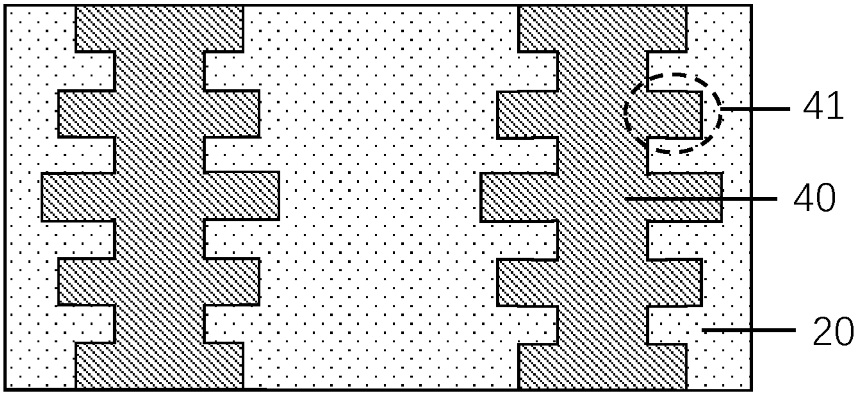
Figure 9I:
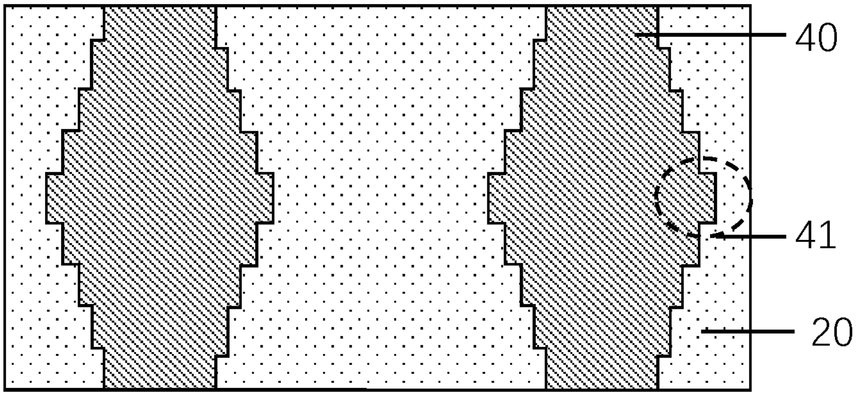
Figure 10A:
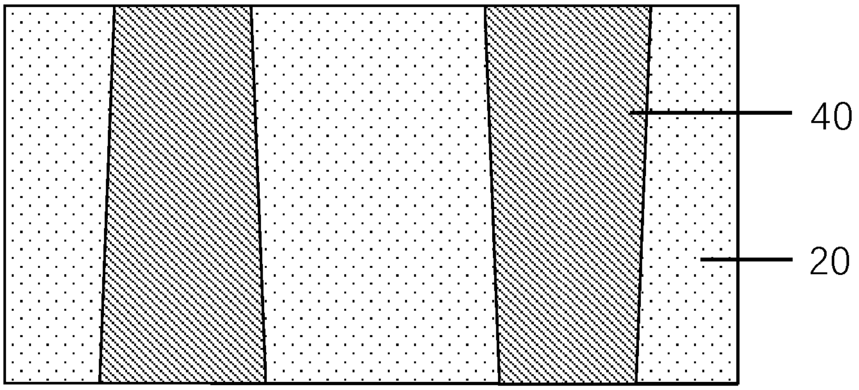
FIG. 10*a* to FIG. 10*g* are schematic top views of intermediate structures of an enhancement-mode semiconductor structure according to some other embodiments of the present disclosure.
Figure 10B:
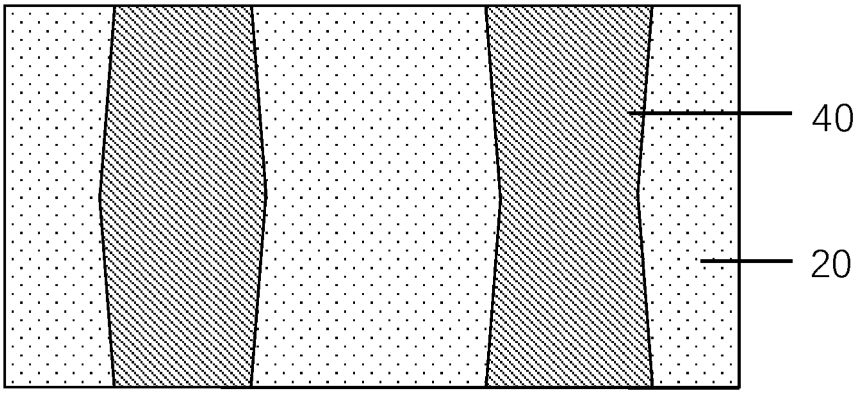
Figure 10C:
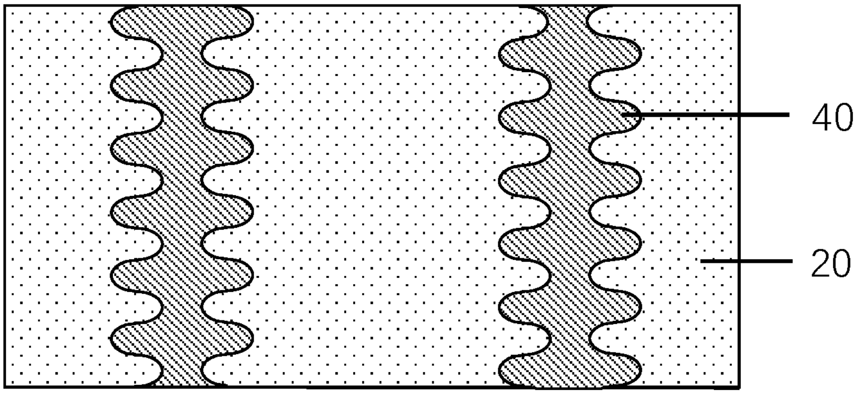
Figure 10D:
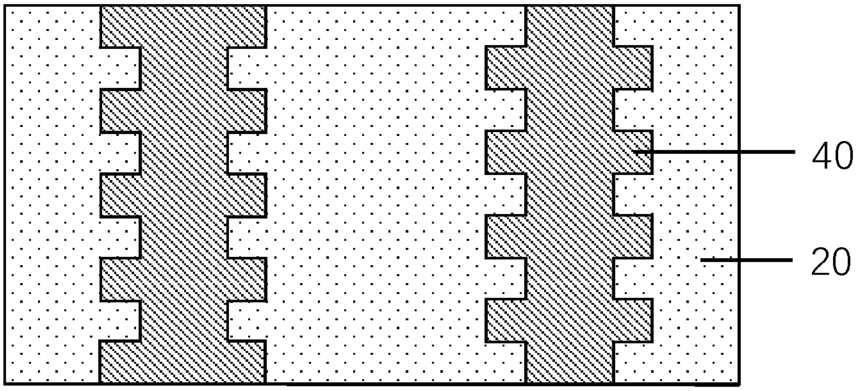
Figure 10E:
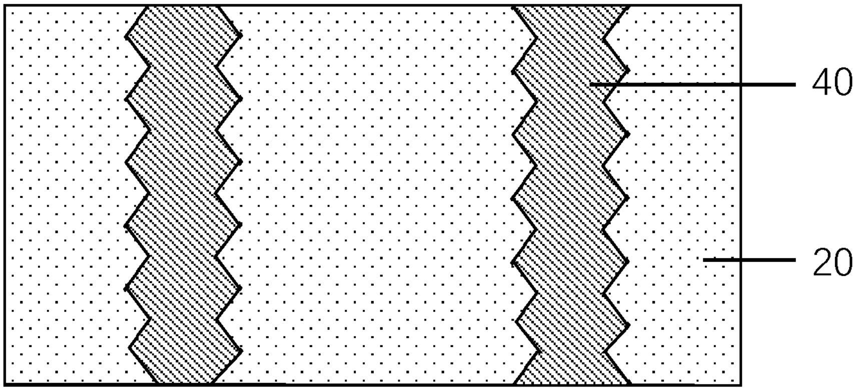
Figure 10F:
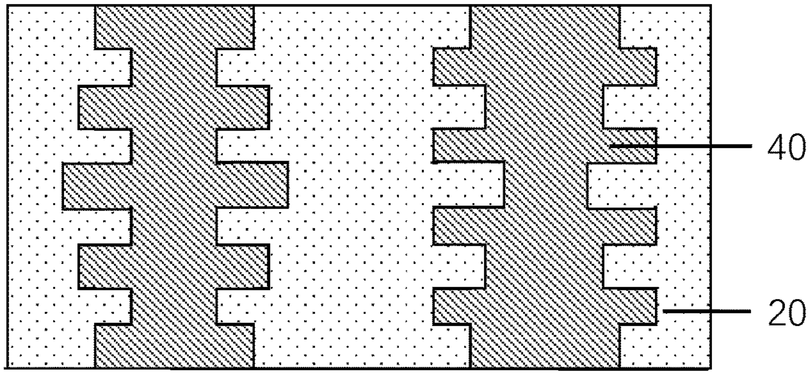
Figure 10G:
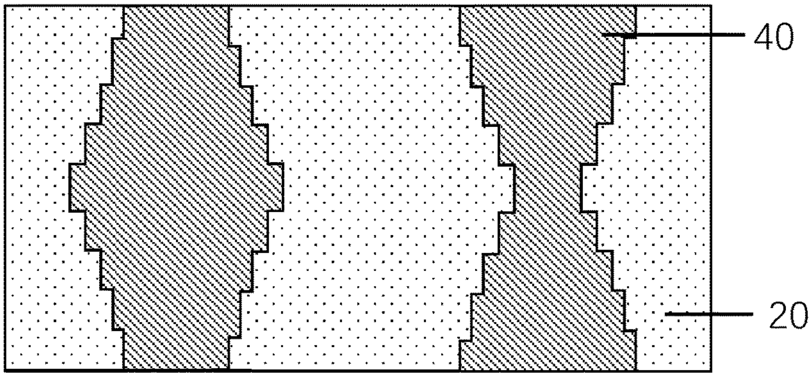

In an embodiment, FIG. 9*a* to FIG. 9*i* are schematic top views of intermediate structures of an enhancement-mode semiconductor structure according to some embodiments of the present disclosure. A change of the width of the third semiconductor layer 40 grown in the groove 31 may be controlled by controlling a change of the width of the groove 31 along the second direction. Along the second direction, a change mode of the width in the third semiconductor layer is increased gradually (as shown in FIG. 9*a*), decreased gradually (as shown in FIG. 9*b*), increased in a step-shaped, decreased in a step-shaped, increased at first and then decreased (as shown in FIG. 9*c*), or decreased at first and then increased (as shown in FIG. 9*d*). Optionally, a projection, on a plane where the substrate is located, of a sidewall, extending along the second direction, of the third semiconductor layer 40 is a sine wave (as shown in FIG. 9*e*), a rectangular wave (as shown in FIG. 9*f*), or a triangular wave (as shown in FIG. 9*g*). Optionally, the sidewall, extending along the second direction, of the third semiconductor layer 40 is provided with a plurality of protrusions, and widths of the plurality of protrusions are increased at first and then decreased along the second direction. The plurality of protrusions are arranged at intervals (as shown in FIG. 9*h*) or adjacent to each other (as shown in FIG. 9*i*). By changing the width of the third semiconductor layer 40 along the second direction, on one hand, a shape of the channel may be changed, the movement path of electrons may be increased, thereby reducing on-state resistance; on the other hand, a width of a depletion layer may be changed, the peak electric field may be reduced, thereby increasing the breakdown voltage; on another hand, a shape of the gate 51 may be the same as the shape of the third semiconductor layer 40, and different control capabilities of the gate at different positions may be provided, thereby improving the linearity of the semiconductor device.

In an embodiment, FIG. 10*a* to FIG. 10*g* are schematic top views of intermediate structures of an enhancement-mode semiconductor structure according to some other embodiments of the present disclosure. A change of a width of the third semiconductor layer 40 grown in the groove 31 may be controlled by controlling a change of a width, along the second direction, of the groove 31. As shown in FIG. 10*a* to FIG. 10*g*, widths of two adjacent third semiconductor layers are complementary along the second direction, that is, a sum of the widths of the adjacent two third semiconductor layers 40 is constant, and then a width of the channel between two adjacent third semiconductor layers 40 is constant. On one hand, the shape of the conductive channel changes with the shape of the third semiconductor layer 40, thereby having a larger movement path of electrons and reducing the on-state resistance of the semiconductor structure. On the other hand, the width of the channel between adjacent two third semiconductor layers 40 is constant, so that the conductive current uniformity of the channel is improved, thereby improving the stability of the semiconductor structure.

Figure 11A:
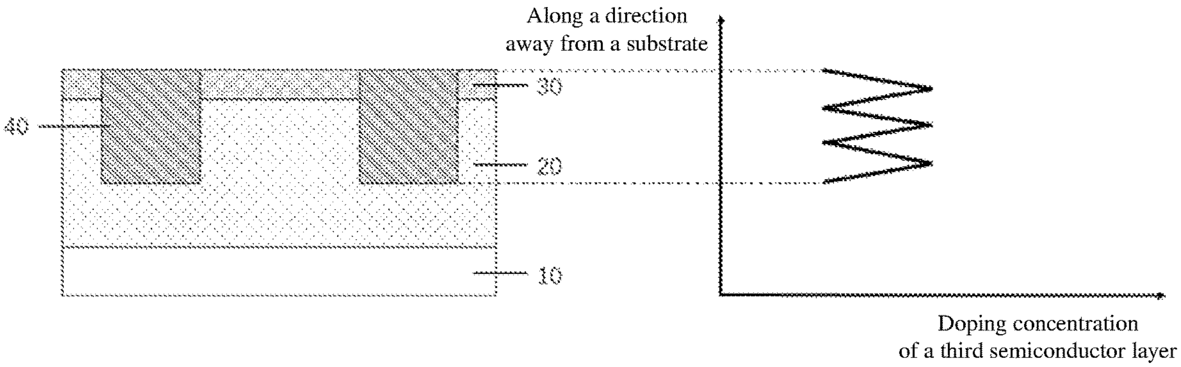
FIG. 11*a* to FIG. 11*e* are schematic diagrams of a change of a doping concentration, along a direction away from a substrate, of a plurality of sublayers of a third semiconductor layer according to some embodiments of the present disclosure.
Figure 11B:
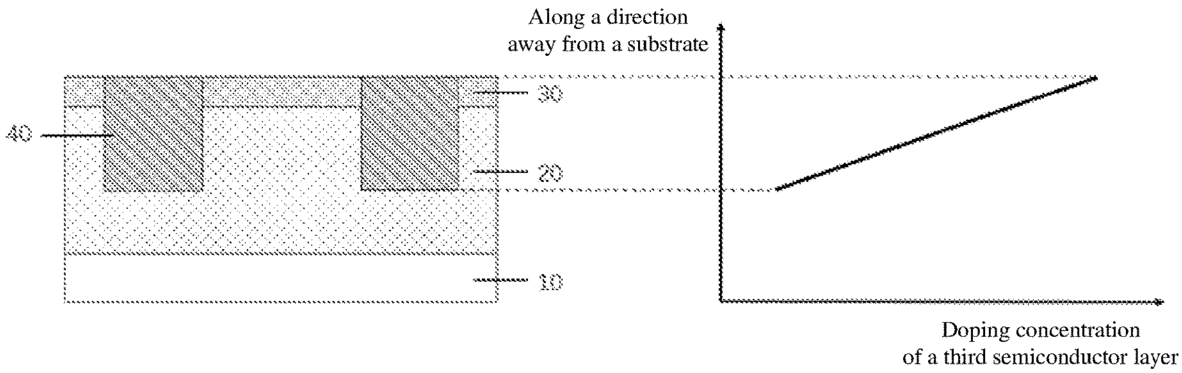
Figure 11C:
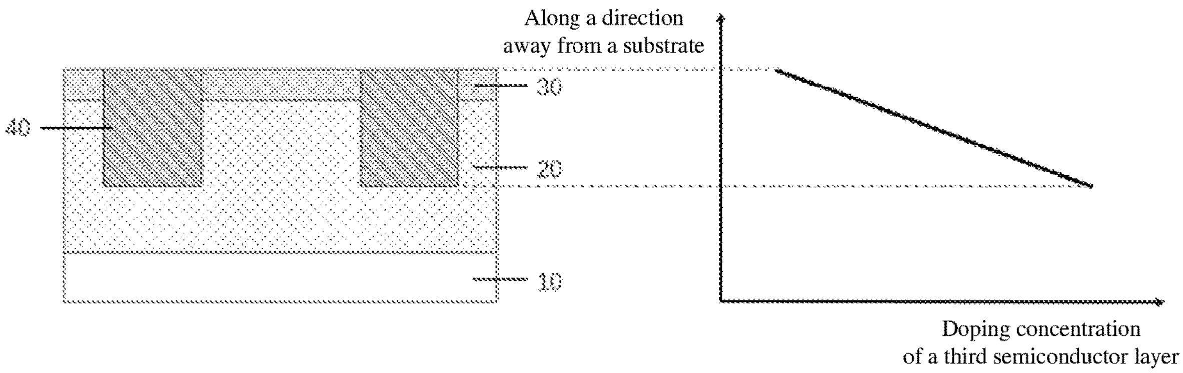
Figure 11D:
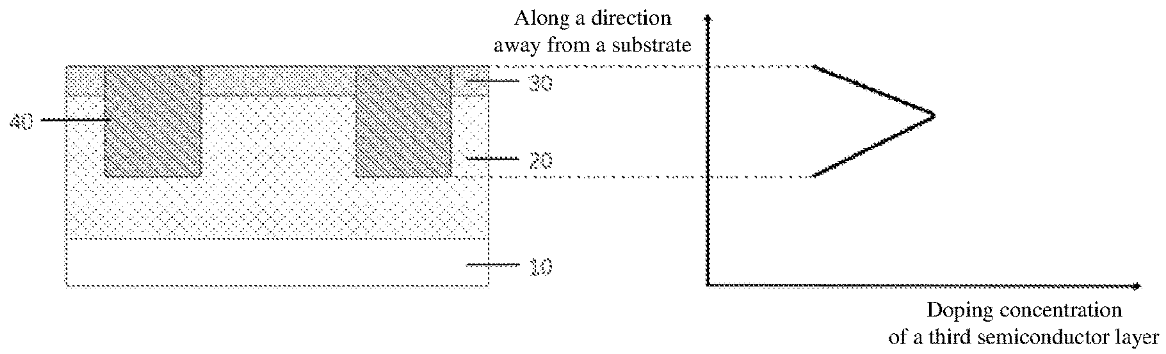
Figure 11E:
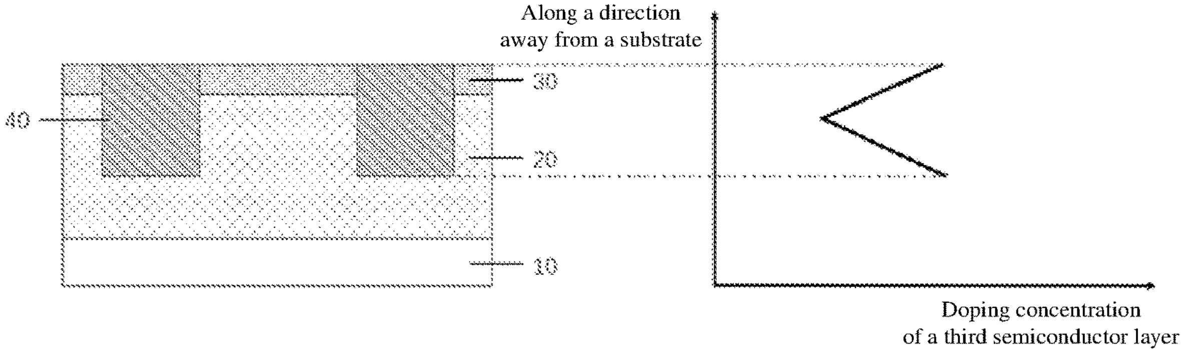

In an embodiment, FIG. 11*a* to FIG. 11*e* are schematic diagrams of a change of a doping concentration, along a direction away from a substrate, of a third semiconductor layer according to some embodiments of the present disclosure. Along the first direction, a change mode of a doping concentration of the third semiconductor layer 40 is changed periodically (as shown in FIG. 11*a*), increased gradually (as shown in FIG. 11*b*), decreased gradually (as shown in FIG. 11*c*), increased at first and then decreased (as shown in FIG. 11*d*), or decreased at first and then increased (as shown in FIG. 11*e*). The doping concentration of the third semiconductor layer 40 is controlled by an in-situ doped selective epitaxy process, to locally modulate a concentration of carriers in the first semiconductor layer 20, that is, the concentration of carriers in the channel is modulated. An effect of local modulation of the concentration of carriers is: in an off-state, a change of a doping concentration of a plurality of sub-layers in the third semiconductor layer 40 may increase the width of a depletion layer and reduce the peak electric field, thereby increasing the breakdown voltage; in an on-state, the structure has a characteristic of reducing on-resistance, so that the semiconductor structure has a lower voltage drop in a condition of high current density when the semiconductor structure is turned on, thereby improving the energy conversion efficiency of a system when the structure is used.

Figure 12:
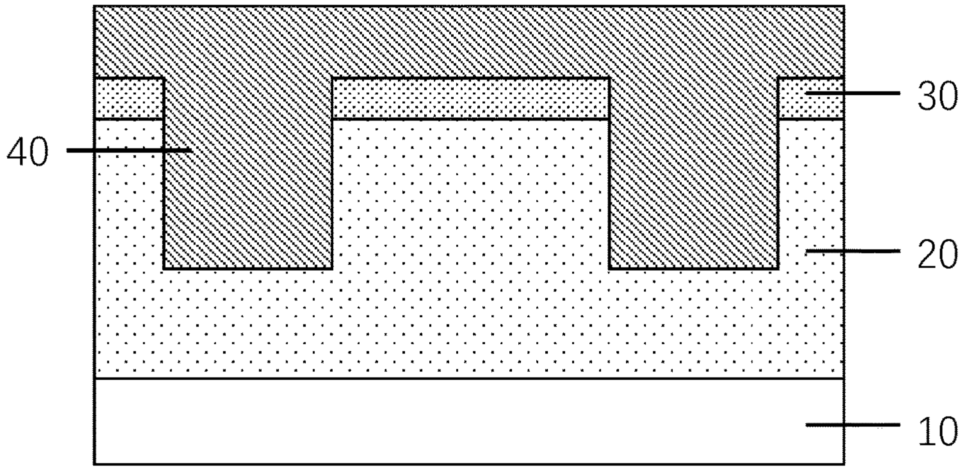
FIG. 12 is a schematic diagram of an intermediate structure of an enhancement-mode semiconductor structure according to an embodiment of the present disclosure.
Figure 13:
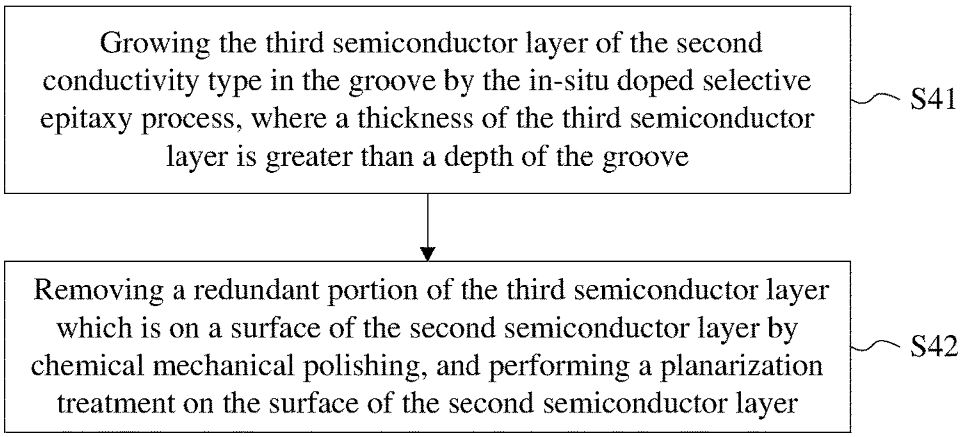
FIG. 13 is a flowchart of a method for growing a third semiconductor layer of a second conductivity type in a groove according to an embodiment of the present disclosure.

In an embodiment, FIG. 12 is a schematic diagram of an intermediate structure of an enhancement-mode semiconductor structure according to an embodiment of the present disclosure. As shown in FIG. 13, Step S4 may include Step 41 and Step 42.

Step 41: Growing the third semiconductor layer 40 of the second conductivity type in the groove 31 by the in-situ doped selective epitaxy process, where a thickness of the third semiconductor layer 40 is greater than a depth of the groove 31. The third semiconductor layer 40 has a healing plane (as shown in FIG. 12).

Step 42: Removing a redundant portion of the third semiconductor layer 40 which is on a surface of the second semiconductor layer 30 by chemical mechanical polishing, and performing a planarization treatment on the surface of the second semiconductor layer 30. Chemical mechanical polishing (CMP) can remove a redundant portion of the third semiconductor layer 40 which is on a surface of the second semiconductor layer 30, so as to obtain a flat, scratch-free and impurity-free surface. It is not necessary to strictly control the thickness of the third semiconductor layer 40 in the growth process. In addition, the surface quality of the semiconductor structure after chemical mechanical polishing is good.

Figure 14:
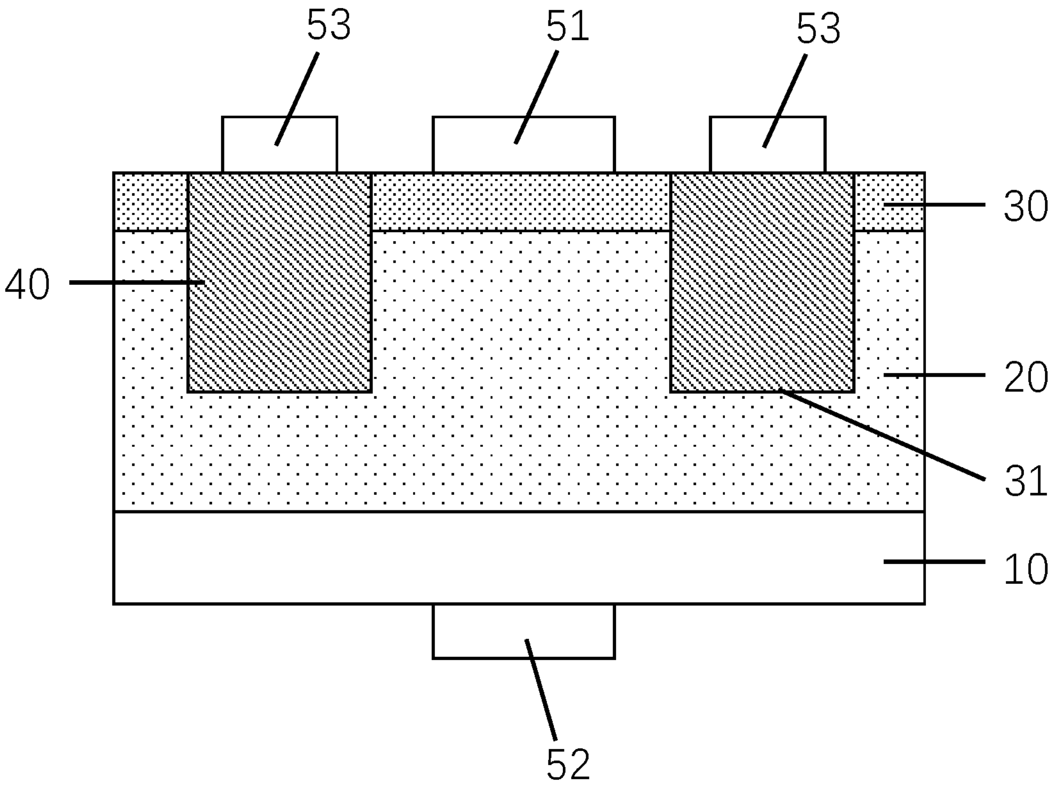
FIG. 14 is a schematic structural diagram of an enhancement-mode semiconductor structure according to an embodiment of the present disclosure.
Figure 15:
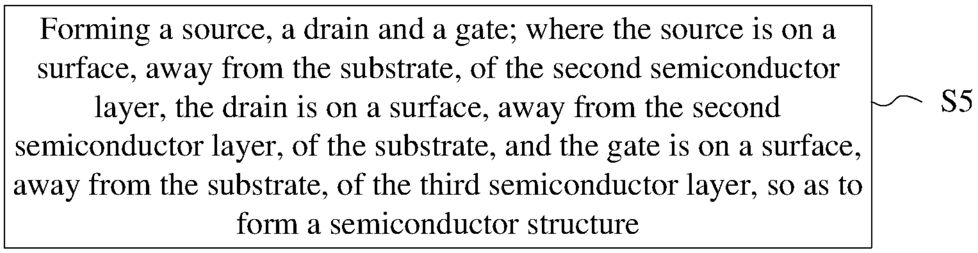
FIG. 15 is a flowchart of a method for manufacturing an enhancement-mode semiconductor structure according to another embodiment of the present disclosure.

In an embodiment, FIG. 14 is a schematic structural diagram of an enhancement-mode semiconductor structure according to an embodiment of the present disclosure. As shown in FIG. 15, after the S4, the method may further include S5.

Step S5: Forming a source 51, a drain 52 and a gate 53; where the source 51 is on a surface, away from the substrate 10, of the second semiconductor layer 30, the drain 52 is on a surface, away from the second semiconductor layer 30, of the substrate 10, and the gate 53 is on a surface, away from the substrate 10, of the third semiconductor layer 40, so as to form a semiconductor structure, as shown in FIG. 14.

Figure 16A:
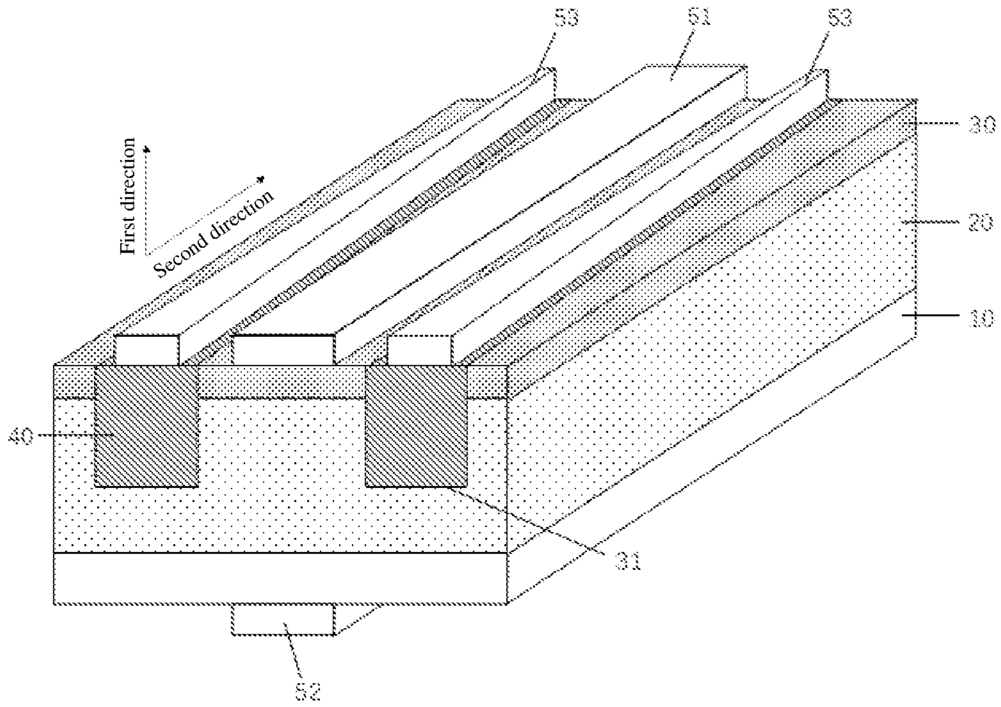
FIG. 16*a* to FIG. 16*c* are schematic structural diagrams of enhancement-mode semiconductor structures according to some embodiments of the present disclosure.
Figure 16B:
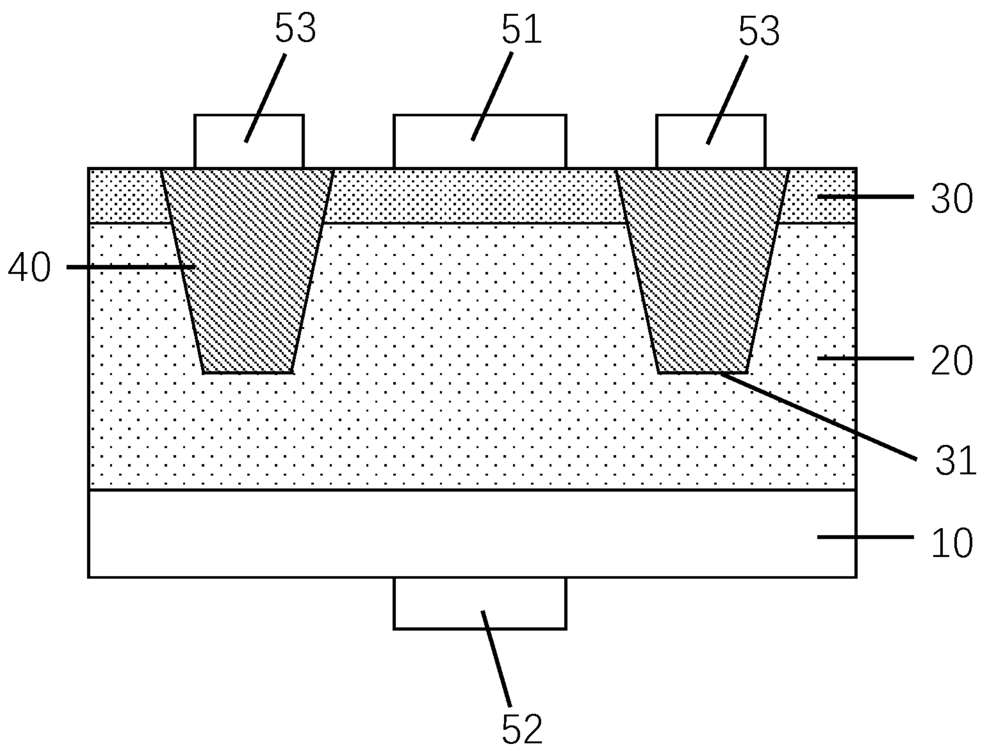
Figure 16C:
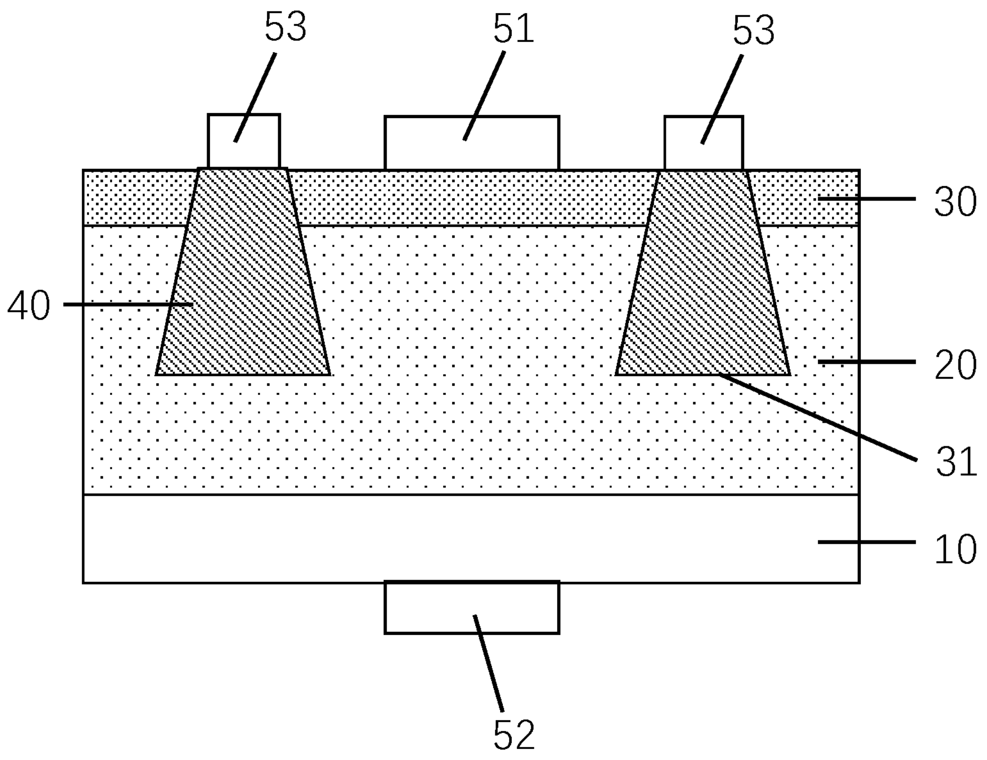

According to another aspect of the present disclosure, an enhancement-mode semiconductor structure is provided in the present disclosure. FIG. 16*a* to FIG. 16*c* are schematic structural diagrams of enhancement-mode semiconductor structures according to some embodiments of the present disclosure. As shown in FIG. 16*a*, the enhancement-mode semiconductor structure includes: a substrate 10 of a first conductivity type, a first semiconductor layer 20 of the first conductivity type and a second semiconductor layer 30 of the first conductivity type which are stacked sequentially, where a doping concentration of the substrate 10 and the second semiconductor layer 30 is higher than a doping concentration of the first semiconductor layer 20; and a groove 31, where the groove 31 penetrates through the second semiconductor layer 30 and partially penetrates through the first semiconductor layer 20, and a third semiconductor layer 40 of the second conductivity type is disposed in the groove 31. The third semiconductor layer 40 has at least two different doping concentrations along a first direction and has at least two different widths along a second direction, the first direction is perpendicular to a plane where the substrate 10 is located, and the second direction is parallel to an extending direction of the groove 31. A depth of the groove 31 is 0.1 μm-2 μm. A spacing between adjacent two grooves 31 is 0.1 μm-1 μm. A channel width of the semiconductor structure may be controlled by controlling the spacing between the adjacent two grooves 31. As shown in FIG. 16*a*, the enhancement-mode semiconductor structure further includes a source 51, a drain 52 and a gate 53. The source 51 is on a surface, away from the substrate 10, of the second semiconductor layer 30, the drain 52 is on a surface, away from the second semiconductor layer 30, of the substrate 10, and the gate 53 is on a surface, away from the substrate 10, of the third semiconductor layer 40.

In an embodiment, a width of the third semiconductor layer 40 is constant (as shown in FIG. 16*a*), increased gradually (as shown in FIG. 16*b*) or decreased gradually (as shown in FIG. 16*c*) along the first direction. The width of the third semiconductor layer 40 may be adjusted by designing the width of the groove 31, to make a contact interface between the third semiconductor layer 40 and the side of the first semiconductor layer 20 be an inclined surface, and a conductivity type of the third semiconductor layer is different from that of the first semiconductor layer, so that the contact interface of the formed PN junction may be an inclined surface. On one hand, by controlling a shape of the contact interface of the PN junction, the breakdown voltage is effectively improved, and the reverse breakdown voltage is increased. On the other hand, in an on-state, since the contact interface is an inclined surface, and a conductive channel is also an inclined channel, electrons which flow from the source to the drain may flow dispersedly to two sides and downward simultaneously, thereby increasing the movement path of electrons, and further reducing the on-state resistance of the semiconductor structure.

In an embodiment, along the second direction, a width of the third semiconductor layer 40 is increased gradually (as shown in FIG. 9*a*), decreased gradually (as shown in FIG. 9*b*), increased in a step-shaped, decreased in a step-shaped, increased at first and then decreased (as shown in FIG. 9*c*), or decreased at first and then increased (as shown in FIG. 9*d*). Optionally, a projection, on a plane where the substrate 10 is located, of a sidewall, extending along the second direction, of the third semiconductor layer 40 is a sine wave (as shown in FIG. 9*e*), a rectangular wave (as shown in FIG. 9*f*), or a triangular wave (as shown in FIG. 9*g*). Optionally, a sidewall, extending along the second direction, of the third semiconductor layer 40 is provided with a plurality of protrusions 41, and widths of the plurality of protrusions 41 are increased at first and then decreased along the second direction. The plurality of protrusions 41 are arranged at intervals (as shown in FIG. 9*h*) or adjacent to each other (as shown in FIG. 9*i*). By changing the width of the third semiconductor layer 40 along the second direction, on one hand, a shape of the channel may be changed, the movement path of electrons may be increased, thereby reducing on-state resistance; on the other hand, a width of a depletion layer may be changed, the peak electric field may be reduced, thereby increasing the breakdown voltage; on another hand, a shape of the gate 51 may be the same as the shape of the third semiconductor layer 40, and different control capabilities of the gate at different positions may be provided, thereby improving the linearity of the semiconductor structure.

In an embodiment, FIG. 10*a* to FIG. 10*g* are schematic top views of intermediate structures of an enhancement-mode semiconductor structure according to some other embodiments of the present disclosure. A change of a width of the third semiconductor layer 40 grown in the groove 31 is controlled by controlling a change of a width, along the second direction, of the groove 31. As shown in FIG. 10*a* to FIG. 10*g*, along the second direction, widths of adjacent two third semiconductor layers are complementary, that is, a sum of the widths of the adjacent two third semiconductor layers 40 is constant, and then a width of a channel between the adjacent two third semiconductor layers 40 is constant. On one hand, the shape of the conductive channel changes with the shape of the third semiconductor layer 40, thereby having a larger movement path of electrons, and reducing the on-state resistance of the semiconductor structure; on the other hand, the width of the channel between adjacent two third semiconductor layers 40 is constant, so that the conductive current uniformity of the channel is improved, thereby improving the stability of the semiconductor structure.

In an embodiment, along the first direction, a change mode of a doping concentration of the third semiconductor layer 40 is change periodically (as shown in FIG. 11*a*), increased gradually (as shown in FIG. 11*b*), decrease gradually (as shown in FIG. 11*c*), increased at first and then decreased (as shown in FIG. 11*d*), or decreased at first and then increased (as shown in FIG. 11*e*). The doping concentration of the third semiconductor layer 40 is controlled by an in-situ doped selective epitaxy process, to locally modulate a concentration of carriers in the first semiconductor layer 20, that is, the concentration of carriers in the channel is modulated. An effect of local modulation of the concentration of carriers is as follows: in an off-state, a change of a doping concentration of a plurality of sub-layers in the third semiconductor layer 40 may increase the width of a depletion layer and reduce the peak electric field, thereby increasing the breakdown voltage; in an on-state, the structure has a characteristic of reducing on-resistance, so that the semiconductor structure has a lower voltage drop in a condition of high current density when the semiconductor structure is turned on, thereby improving the energy conversion efficiency of a system when the structure is used.

Figure 17:
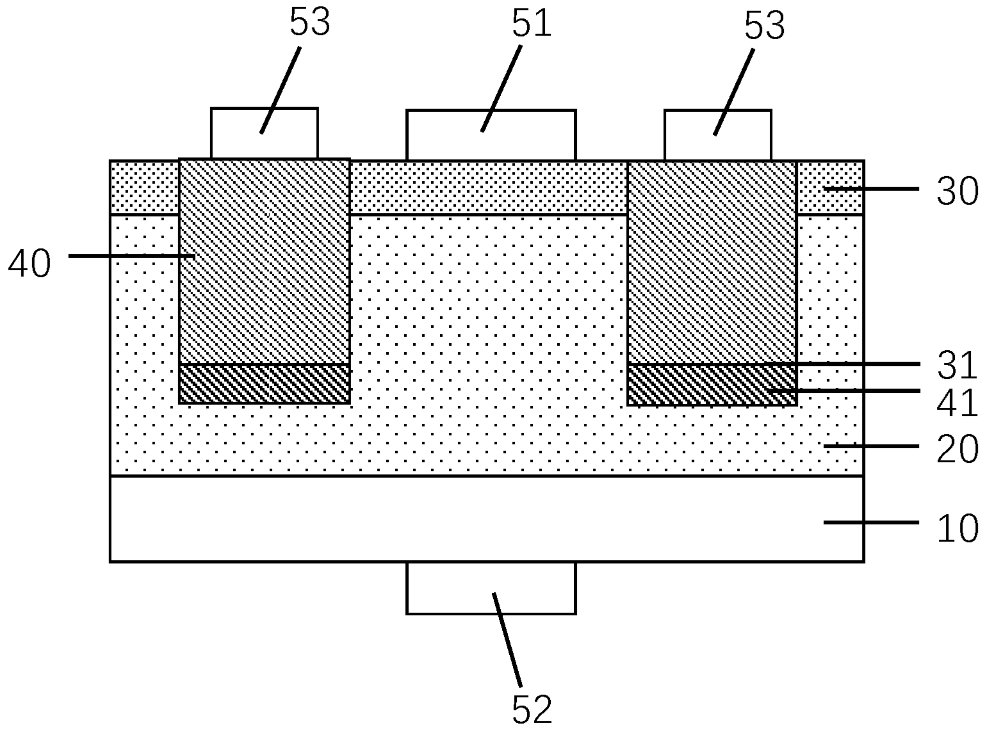
FIG. 17 is a schematic structural diagram of an enhancement-mode semiconductor structure according to another embodiment of the present disclosure.

In an embodiment, FIG. 17 is a schematic structural diagram of an enhancement-mode semiconductor structure according to another embodiment of the present disclosure. As shown in FIG. 17, the enhancement-mode semiconductor structure further includes: a fourth semiconductor layer 41 of a second conductivity type, where the fourth semiconductor layer 41 is disposed in the first semiconductor layer 20 below the groove 31. A doping concentration of the fourth semiconductor layer 41 is greater than the doping concentration of the third semiconductor layer 40 so as to prevent injection of minority carriers in forward operation. Since the diffusion of implanted ions, a width of the fourth semiconductor layer 41 is greater than or equal to a width of the groove 31, that is, a width of the fourth semiconductor layer 41 is greater than or equal to a width of the third semiconductor layer 40 that is grown subsequently in the groove 31. A thickness of the fourth semiconductor layer is 50 nm-500 nm. Before the third semiconductor layer 40 is formed, the fourth semiconductor layer 41 with a same conductive type as the third semiconductor layer 40 is formed. In this way, the lattice quality of the third semiconductor layer 40 subsequently grown on the surface of the fourth semiconductor layer 41 is improved, thereby improving the reliability of the overall device structure.

An enhancement-mode semiconductor structure and a method for manufacturing the same is provided in the present disclosure. A substrate of a first conductivity type, a first semiconductor layer of the first conductivity type and a second semiconductor layer of the first conductivity type are stacked sequentially; a groove is etched to penetrate through the second semiconductor layer and partially penetrate through the first semiconductor layer; a third semiconductor layer of a second conductivity type is grown in the groove by an in-situ doped selective epitaxy process, and the third semiconductor layer has at least two different doping concentrations along a first direction and has at least two different widths along a second direction.

A first beneficial effect: in the present disclosure, a third semiconductor layer is grown by an in-situ doped selective epitaxy process after a groove is etched, so that a PN junction is formed by the third semiconductor layer and a first semiconductor layer with different conductive types. A channel is in a depletion state when a gate voltage is 0, thereby achieving an enhancement-mode semiconductor structure. A method for etching the groove 31 may control a shape of the third semiconductor layer 40 by controlling a shape of the groove, thereby adjusting and controlling a shape of a depletion layer and a shape of the channel. An in-situ doped selective epitaxy method may control a doping concentration of the third semiconductor layer, thereby changing an equivalent width of the depletion layer. The combination of two methods may adjust and control the depletion layer and the channel of the semiconductor structure multi-dimensionally. Moreover, the third semiconductor layer is formed by the in-situ doped selective epitaxy process method, so that lattice damage, caused by an ion implantation method, to the first semiconductor layer is avoided, and the width inaccuracy, caused by a diffusion phenomenon of the ion implantation method, of the third semiconductor layer 40 is avoided, thereby improving the width accuracy of the channel between third semiconductor layers and improving the reliability of the overall device structure.

A second beneficial effect: in the present disclosure, a width of a third semiconductor layer along a first direction and a width of the third semiconductor layer along a second direction are adjusted simultaneously, so that a shape of a depletion layer of a PN junction which is formed by the third semiconductor layer and a first semiconductor layer is adjusted. On one hand, when a gate voltage is 0, a channel is completely pinched off by a depletion layer to realize an enhancement-mode semiconductor structure. On the other hand, in an on-state, a shape of a conductive channel changes with a shape of the third semiconductor layer, thereby having a larger movement path of electrons, and reducing the on-state resistance of the semiconductor structure.

A third beneficial effect: in the present disclosure, a doping concentration of a third semiconductor layer is controlled to locally modulate a concentration of carriers in a first semiconductor layer, that is, a concentration of carriers in a channel is modulated. An effect of local modulation of the concentration of carriers is: in an off-state, a change of a doping concentration of the third semiconductor layer may increase a width of a depletion layer and reduce the peak electric field, thereby increasing the breakdown voltage; in an on-state, the structure has a characteristic of reducing the on-resistance, so that the semiconductor structure has a lower voltage drop in a condition of high current density when the semiconductor structure is turned on, thereby improving the energy conversion efficiency of a system when the structure is used.

A fourth beneficial effect: in the present disclosure, before a third semiconductor layer 40 is grown in the groove by the secondary epitaxy, a fourth semiconductor layer with a same conductivity type as the third semiconductor layer is formed in the groove by ion implantation, which is beneficial for improving the lattice quality of the third semiconductor layer, thereby improving the reliability of the overall device structure.

It should be understood that the terms "including" and variations thereof used in the present disclosure are open ended, which means "including but not limited to". The term "one embodiment" means "at least one embodiment"; the term "another embodiment" means "at least one other embodiment". In this specification, the schematic expressions of the above terms do not necessarily refer to the same embodiments or examples. Furthermore, the specific features, structures, materials, or characteristics described may be combined in any suitable manner in any one or more embodiments or examples. In addition, in the case of no contradiction, a person skilled in the art may combine and integrate different embodiments or examples described in this specification, as well as features of different embodiments or examples.

The above are only preferred embodiments of the present application, and are not intended to limit the protection scope of the present application. Any modification, equivalent replacement, improvement and the like made within the spirit and principle of this application shall be included within the protection scope of this application.

What is claimed is:

1. A method for manufacturing an enhancement-mode semiconductor structure, comprising:

S1, providing a substrate of a first conductivity type;

S2, growing a first semiconductor layer of the first conductivity type and a second semiconductor layer of the first conductivity type on the substrate sequentially, wherein a doping concentration of the substrate and the second semiconductor layer is higher than a doping concentration of the first semiconductor layer;

S3, etching a groove on a side, away from the substrate, of the second semiconductor layer, wherein the groove penetrates through the second semiconductor layer and partially penetrates through the first semiconductor layer; and

S4, growing a third semiconductor layer of a second conductivity type in the groove by an in-situ doped selective epitaxy process, wherein the third semiconductor layer has at least two different doping concentrations along a first direction and has at least two different widths along a second direction, the first direction is perpendicular to a plane where the substrate is located, and the second direction is parallel to an extending direction of the groove.

2. The method according to claim 1, wherein along the first direction, a change mode of a doping concentration of the third semiconductor layer is changed periodically, increased gradually, decreased gradually, increased at first and then decreased, or decreased at first and then increased.

3. The method according to claim 1, wherein along the first direction, a change mode of a width of the third semiconductor layer is constant, increased gradually, or decreased gradually.

4. The method according to claim 1, wherein along the second direction, a change mode of a width of the third semiconductor layer is increased gradually, decreased gradually, increased in a step-shaped, decreased in a step-shaped, increased at first and then decreased, or decreased at first and then increased.

5. The method according to claim 1, wherein a projection, on a plane where the substrate is located, of a sidewall, extending along the second direction, of the third semiconductor layer is a sine wave, a rectangular wave, or a triangular wave.

6. The method according to claim 1, wherein a sidewall, extending along the second direction, of the third semiconductor layer is provided with a plurality of protrusions, and widths of the plurality of protrusions are increased at first and then decreased along the second direction.

7. The method according to claim 6, wherein the plurality of protrusions are arranged at intervals or adjacent to each other.

8. The method according to claim 1, wherein widths of adjacent two third semiconductor layers are complementary along the second direction.

9. The method according to claim 1, wherein the groove is etched twice to form a bottom rounded structure.

10. The method according to claim 1, wherein after the S3, the method further comprises:

S31, performing ion implantation on a surface of the first semiconductor layer exposed by the groove, to form a fourth semiconductor layer of the second conductivity type.

11. The method according to claim 10, wherein a doping concentration of the fourth semiconductor layer is greater than the doping concentration of the third semiconductor layer.

12. The method according to claim 1, wherein the S4 comprises:

S41, growing the third semiconductor layer of the second conductivity type in the groove by the in-situ doped selective epitaxy process, wherein a thickness of the third semiconductor layer is greater than a depth of the groove; and S42, removing a redundant portion of the third semiconductor layer which is on a surface of the second semiconductor layer by chemical mechanical polishing, and performing a planarization treatment on the surface of the second semiconductor layer.

13. The method according to claim 1, wherein after the S4, the method further comprises:

S5, forming a source, a drain and a gate, wherein the source is on a surface, away from the substrate, of the second semiconductor layer, the drain is on a surface, away from the second semiconductor layer, of the substrate, and the gate is on a surface, away from the substrate, of the third semiconductor layer.

14. An enhancement-mode semiconductor structure, comprising:

a substrate of a first conductivity type, a first semiconductor layer of the first conductivity type and a second semiconductor layer of the first conductivity type which are stacked sequentially, wherein a doping concentration of the substrate and the second semiconductor layer is higher than a doping concentration of the first semiconductor layer; and a groove, wherein the groove penetrates through the second semiconductor layer and partially penetrates through the first semiconductor layer, and a third semiconductor layer of the second conductivity type is disposed in the groove;

wherein the third semiconductor layer has at least two different doping concentrations along a first direction and has at least two different widths along a second direction, the first direction is perpendicular to a plane where the substrate is located, and the second direction is parallel to an extending direction of the groove.

15. The enhancement-mode semiconductor structure according to claim 14, wherein a depth of the groove is 0.1 μm-2 μm.

16. The enhancement-mode semiconductor structure according to claim 14, wherein a spacing between adjacent two grooves is 0.1 μm-1 μm.

17. The enhancement-mode semiconductor structure according to claim 14, further comprising:

a fourth semiconductor layer of the second conductivity type, wherein the fourth semiconductor layer is disposed in the first semiconductor layer below the groove.

18. The enhancement-mode semiconductor structure according to claim 17, wherein a width of the fourth semiconductor layer is greater than or equal to a width of the third semiconductor layer.

19. The enhancement-mode semiconductor structure according to claim 17, wherein a thickness of the fourth semiconductor layer is 50 nm-500 nm.

20. The enhancement-mode semiconductor structure according to claim 14, wherein along the first direction, a change mode of the doping concentration of the third semiconductor layer is changed periodically, increased gradually, decreased gradually, increased at first and then decreased, or decreased at first and then increased.

* * * * *